(12) United States Patent
Wei et al.

(10) Patent No.: US 10,566,538 B2
(45) Date of Patent: Feb. 18, 2020

(54) APPARATUS AND METHOD FOR FORMING ORGANIC THIN FILM SOLAR BATTERY

(71) Applicants: Tsinghua University, Beijing (CN); HON HAI PRECISION INDUSTRY CO., LTD., New Taipei (TW)

(72) Inventors: Yang Wei, Beijing (CN); Hao-Ming Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 120 days.

(21) Appl. No.: 15/488,398

(22) Filed: Apr. 14, 2017

(65) Prior Publication Data

US 2017/0346014 A1  Nov. 30, 2017

(30) Foreign Application Priority Data

May 31, 2016  (CN) .......................... 2016 1 0375843

(51) Int. Cl.
*H01L 51/00* (2006.01)
*H01L 31/02* (2006.01)
*H01L 31/0224* (2006.01)
*H01L 31/0352* (2006.01)

(52) U.S. Cl.
CPC .... *H01L 51/0048* (2013.01); *H01L 31/02008* (2013.01); *H01L 31/022425* (2013.01); *H01L 31/035227* (2013.01)

(58) Field of Classification Search
None
See application file for complete search history.

(56) References Cited

U.S. PATENT DOCUMENTS

| 2003/0230238 | A1 | 12/2003 | Papadimitrakopoulos |
| 2004/0248394 | A1* | 12/2004 | Kobayashi .............. C23C 14/08 438/609 |
| 2005/0061364 | A1 | 3/2005 | Peumans et al. |
| 2012/0028408 | A1 | 2/2012 | Baker et al. |
| 2016/0021467 | A1 | 1/2016 | Wei et al. |

FOREIGN PATENT DOCUMENTS

| CN | 105338460 | 2/2016 |
| JP | 20070525010 A | 8/2007 |

* cited by examiner

*Primary Examiner* — Shannon M Gardner
(74) *Attorney, Agent, or Firm* — ScienBiziP, P.C.

(57) ABSTRACT

A method for forming an organic thin film solar battery includes steps of: providing a substrate and an evaporating source; forming a first electrode on a surface of the substrate; spacing the evaporating source from the first electrode, and heating the carbon nanotube film structure to gasify the photoactive material and form a photoactive layer on a surface of the first electrode; and forming a second electrode on a surface of the photoactive layer.

19 Claims, 13 Drawing Sheets

APPARATUS AND METHOD FOR FORMING ORGANIC THIN FILM SOLAR BATTERY

CROSS-REFERENCE TO RELATED APPLICATIONS

This application claims priority to Chinese Patent Application No. 201610375843.9, filed on May 31, 2016, the disclosure of which is incorporated herein by reference.

FIELD

The present disclosure relates to a apparatus and a method for forming an organic thin film solar battery.

BACKGROUND

An organic thin film solar battery is widely researched because the organic thin film solar battery has many advantages, such as low-cost, lightweight, flexible, and simple production process. The organic thin film solar battery can be a dye-sensitized solar battery, a heterojunction solar battery or a perovskite solar battery. An active layer of the organic thin-film solar battery can be formed by various methods, such as vapor deposition method, spin coating method and spraying method. However, when making a large film by the above methods, a large uniform film is hard to make. The vapor deposition method is a process of heating the evaporating source to vaporize the vapor deposition material and depositing a film on a surface of a substrate. In order to form a uniform film, it is necessary to form a uniform gaseous vapor deposition material around the substrate. When a quantity of the evaporating source is two or more, an evaporation rate of each evaporating source is difficult to control, and it is difficult to form a mixed gas of the vapor deposition material with a required ratio. It is difficult to control an atom diffusion direction of a gaseous vapor deposition material, and most of the vapor deposition material can not adhere to the surface of the substrate. Thus, a deposition rate of the vapor deposition material is low.

BRIEF DESCRIPTION OF THE DRAWINGS

Implementations of the present technology will now be described, by way of example only, with reference to the attached figures.

DETAILED DESCRIPTION

Figure 1:
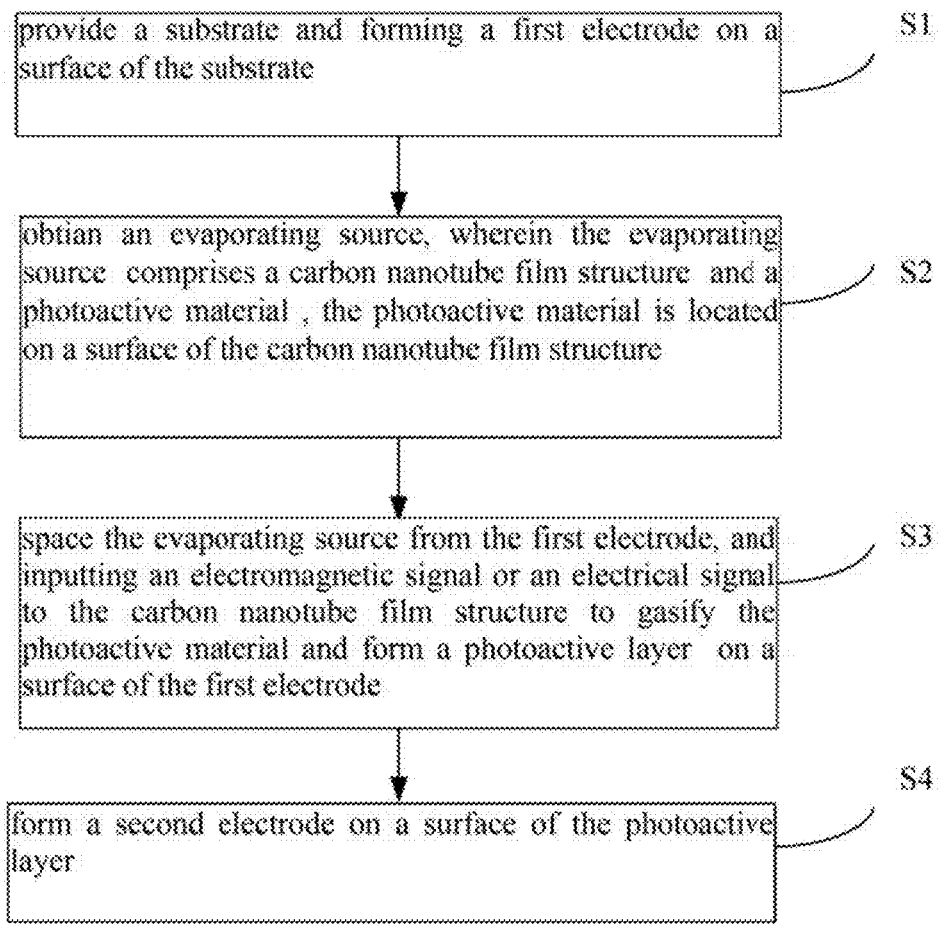
FIG. 1 is a flowchart of one embodiment of a method for forming an organic thin film solar battery.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like.

Figure 2:
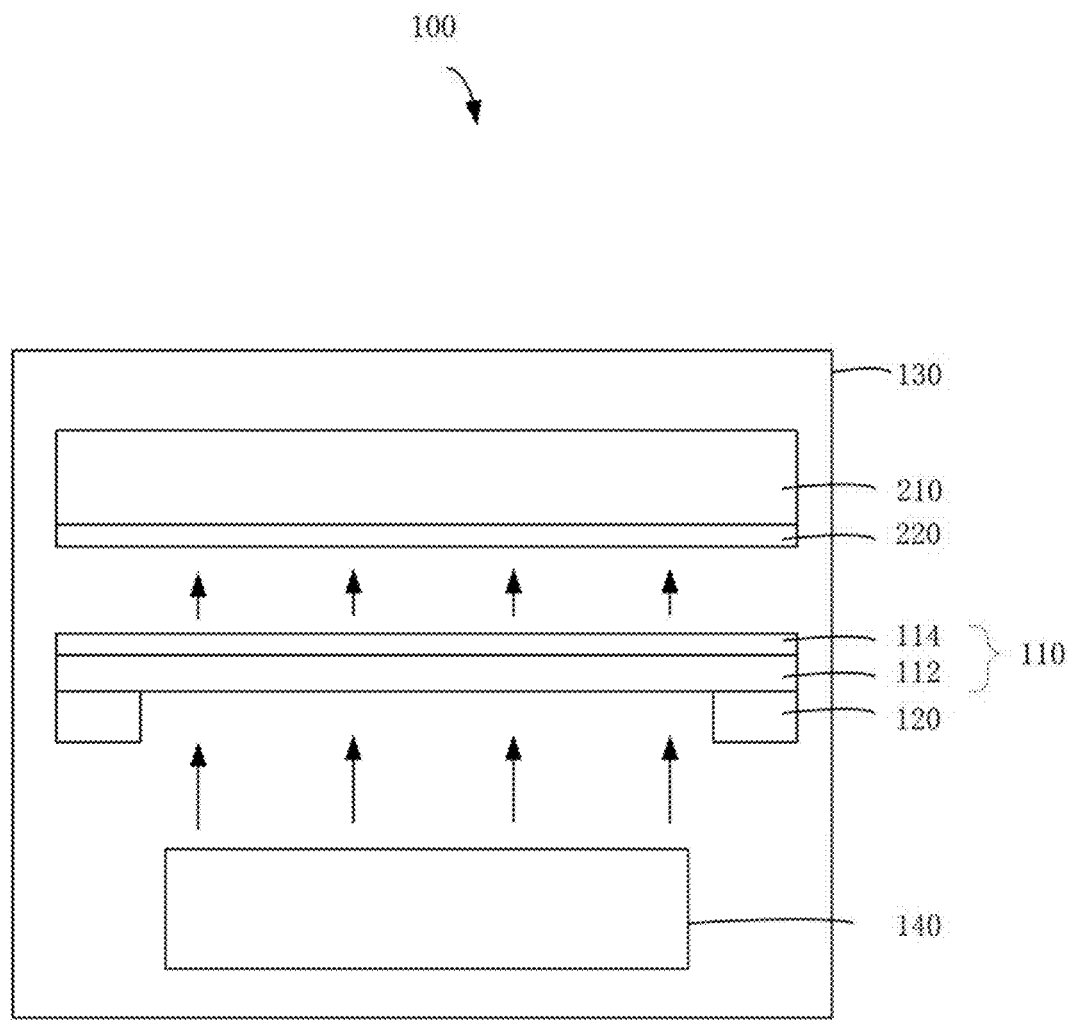
FIG. 2 is a side view of one embodiment of an apparatus for forming the organic thin film solar battery.
Figure 3:
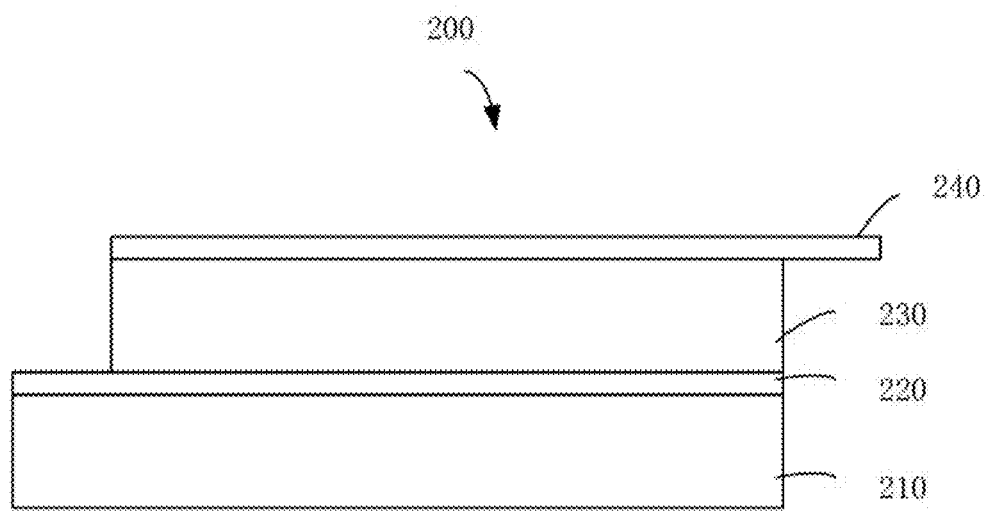
FIG. 3 is a side view of one embodiment of the organic thin film solar battery.

Referring to FIG. 1 to FIG. 3, a method for forming an organic thin film solar battery 200 according to one embodiment is provided. The method of forming the organic thin film solar battery 200 comprises the following steps:

S1: providing a substrate 210 and forming a first electrode 220 on a surface of the substrate 210;

S2: obtaining an evaporating source 110, wherein the evaporating source 110 comprises a carbon nanotube film structure 112 and a photoactive material 114, and the photoactive material 114 is located on a surface of the carbon nanotube film structure 112;

S3: spacing the evaporating source 110 from the first electrode 220, and inputting an electromagnetic signal or an electrical signal to heat the carbon nanotube film structure 112 to gasify the photoactive material 114 and form a photoactive layer 230 on a surface of the first electrode 220; and S4: forming a second electrode 240 on a surface of the photoactive layer 230.

The substrate 210 is an insulating substrate. The substrate 210 can be a hard substrate or a flexible substrate. The first electrode 220 and the second electrode 240 both are conductive layers. If a light incident surface of the organic thin film solar battery 200 is a surface of the substrate 210, the substrate 210 can be a transparent substrate, such as a glass substrate, a quartz substrate, a transparent plastic substrate or a resin substrate. The first electrode 220 can be a transparent conductive layer or a porous network structure, such as an ITO layer, an FTO layer or a carbon nanotube film. The second electrode 240 can be the transparent conductive layer, an opaque conductive layer or the porous network structure, such as a metal thin film, a metal mesh, the ITO layer, the FTO layer or the carbon nanotube film. If the light incident surface of the organic thin film solar battery 200 is a surface of the second electrode 240, the substrate 210 may be an opaque substrate, such as a silicon substrate. The second electrode 240 can be the transparent conductive layer or the porous network structure, such as the ITO layer, the FTO layer or the carbon nanotube film. The first electrode 220 can be the transparent conductive layer, the opaque conductive layer or the porous network structure, such as the metal thin film, the metal mesh, the e ITO layer, the FTO layer or the carbon nanotube film. The first electrode 220 and the second electrode 240 may be formed by a conventional method, such as a vapor deposition method, a sputtering method or a coating method. In one embodiment, the photoactive material 114 is a material of the photoactive layer 230. In another embodiment, the photoactive material 114 is a precursor for forming the photoactive layer 230, and the precursor reacts to form the material of the photoactive layer 230 during vapor deposition.

The organic thin film solar battery 200 can be a dye-sensitized solar battery, a heterojunction solar battery, and a perovskite solar battery. A material of the photoactive layer 230 of the perovskite solar battery is an organometallic semiconductor light absorbing material with a perovskite-structured. The organometallic semiconductor light absorbing material can have a chemical formula of $ABX_3$. A is an organic amine ion, and A can be $CH_3NH_3^+$, $C_2H_5NH_3^+$ or $NH_2CH=NH_2^+$ or. B is a divalent metal ion, and B can be $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$ or $Eu^{2+}$. X is a halogen ion or a quasi-halogen ion, and X can be $Cl^-$, $Br^-$, $I^-$, $CN^-$, $NCO^-$, $NCS^-$ or $NCSe^-$.

In one embodiment, the organic thin film solar battery 200 is a perovskite solar battery. The light incident surface is the surface of the substrate 210, and the substrate 210 is a transparent insulating substrate. The first electrode 220 is a transparent conductive layer, and the second electrode 240 is a metal thin layer. The material of the photoactive layer 230 is $CH_3NH_3PbI_3$, and the photoactive material 114 is a mixture of methyl ammonium iodide and lead iodide.

The carbon nanotube film structure 112 is a carrying structure for the photoactive material 114. The photoactive material 114 is located on a surface of the carbon nanotube film structure 112. The carbon nanotube film structure 112 is capable of forming a free-standing structure and can be suspended by supporters. The photoactive material 114 is located on a surface of a suspended carbon nanotube film structure 112. In one embodiment, in S2, two supporters 120 are provided. The two supporters 120 are spaced from each other and located on opposite two ends of the carbon nanotube film structure 112. The carbon nanotube film structure 112 is suspended by the two supporters 120. The photoactive material 114 is located on a suspended surface of carbon nanotube film structure 112.

The carbon nanotube film structure 112 comprises a single carbon nanotube film or at least two stacked carbon nanotube films. The carbon nanotube film comprises a plurality of nanotubes. The plurality of nanotubes are generally parallel to each other and arranged substantially parallel to a surface of the carbon nanotube film structure 112. The carbon nanotube film structure 112 has uniform thickness. The carbon nanotube film can be regarded as a macro membrane structure. In the macro membrane structure, an end of one carbon nanotube is joined to another end of an adjacent carbon nanotube arranged substantially along the same direction by Van der Waals attractive force. The carbon nanotube film structure 112 and the carbon nanotube film have a macro area and a microscopic area. The macro area denotes a membrane area of the carbon nanotube film structure 112 or the carbon nanotube film when the carbon nanotube film structure 112 or the carbon nanotube film is regarded as a membrane structure. In terms of a microscopic area, the carbon nanotube film structure 112 or the carbon nanotube film is a network structure having a large number of nanotubes joined end to end. The microscopic area signifies a surface area of the carbon nanotubes actually carrying the photoactive material 114.

In one embodiment, the carbon nanotube film is formed by drawing from a carbon nanotube array. This carbon nanotube array is grown on a growth surface of a substrate by chemical vapor deposition method. The carbon nanotubes in the carbon nanotube array are substantially parallel to each other and perpendicular to the growth surface of the substrate.

Adjacent carbon nanotubes make mutual contact and combine by van der Waals forces. By controlling the growth conditions, the carbon nanotube array is substantially free of impurities such as amorphous carbon or residual catalyst metal particles. The carbon nanotube array being substantially free of impurities with carbon nanotubes in close contact with each other, there is a larger van der Waals forces between adjacent carbon nanotubes. When carbon nanotube fragments (CNT fragments) are drawn, adjacent carbon nanotubes are continuously drawn out end to end by van der Waals forces to form a free-standing and uninterrupted macroscopic carbon nanotube film. The carbon nanotube array made of carbon nanotubes drawn end to end is also known as a super-aligned carbon nanotube array. In order to grow the super-aligned carbon nanotube array, the growth substrate material can be a P-type silicon, an N-type silicon, or a silicon oxide substrate.

Figure 4:
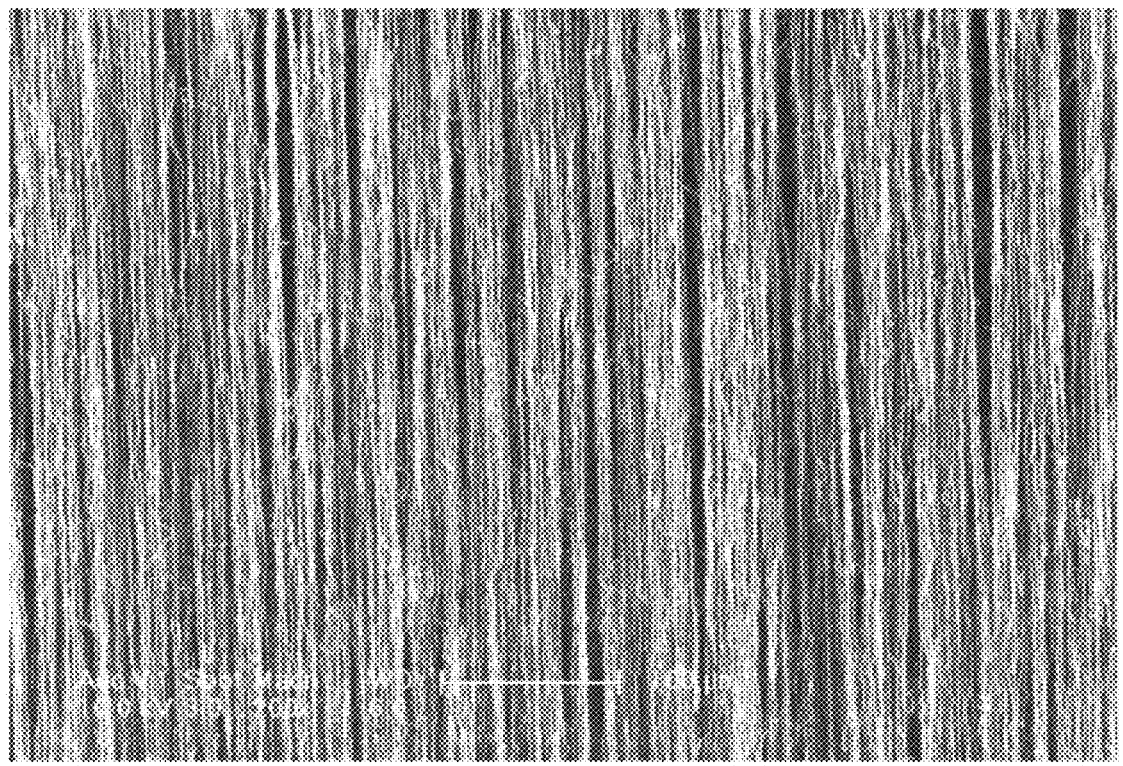
FIG. 4 is a scanning electron microscope (SEM) image of a carbon nanotube film drawn from a carbon nanotube array.

The carbon nanotube film includes a plurality of carbon nanotubes that can be joined end to end and arranged substantially along the same direction. Referring to FIG. 4, a majority of carbon nanotubes in the carbon nanotube film can be oriented along a preferred orientation, meaning that a large number of the carbon nanotubes in the carbon nanotube film are arranged substantially along the same direction. An end of one carbon nanotube is joined to another end of an adjacent carbon nanotube arranged substantially along the same direction by Van der Waals attractive force. A small number of the carbon nanotubes are randomly arranged in the carbon nanotube film and has a small if not negligible effect on the larger number of the carbon nanotubes in the carbon nanotube film arranged substantially along the same direction.

More specifically, the carbon nanotube drawn film includes a plurality of successively oriented carbon nanotube segments joined end-to-end by Van der Waals attractive force therebetween. Each carbon nanotube segment includes a plurality of carbon nanotubes substantially parallel to each other and joined by Van der Waals attractive force therebetween. The carbon nanotube segments can vary in width, thickness, uniformity, and shape. The carbon nanotubes in the carbon nanotube drawn film are also substantially oriented along a preferred orientation.

Microscopically, the carbon nanotubes oriented substantially along the same direction may not be perfectly aligned in a straight line, and some curve portions may exist. It can be understood that some carbon nanotubes located substantially side by side and oriented along the same direction in contact with each other cannot be excluded. The carbon nanotube film includes a plurality of gaps between the adjacent carbon nanotubes so that the carbon nanotube film can have better transparency and higher specific surface area.

The carbon nanotube film is capable of forming a free-standing structure. The term "free-standing structure" can be defined as a structure that does not require a substrate for support. For example, a free standing structure can sustain the weight of itself when it is hoisted by a portion thereof without any damage to its structural integrity. So, if the carbon nanotube drawn film is placed between two separate supporters, a portion of the carbon nanotube drawn film, not in contact with the two supporters, would be suspended between the two supporters and yet maintain film structural integrity. The free-standing structure of the carbon nanotube drawn film is realized by the successive carbon nanotubes joined end to end by Van der Waals attractive force.

The carbon nanotube film has a small and uniform thickness in a range from about 0.5 nm to 10 microns. Since the carbon nanotube film drawn from the carbon nanotube array can form the free-standing structure only by van der Waals forces between the carbon nanotubes, the carbon nanotube film has a large specific surface area. In one embodiment, the specific surface area of the carbon nanotube film measured by the BET method is in a range from about 200 $m^2/g$ to 2600 $m^2/g$. A mass per unit area of the carbon nanotube film is in a range from about 0.01 $g/m^2$ to about 0.1 $g/m^2$ (area here refers to the macro area of the carbon nanotube film). In another embodiment, the mass per unit area of the carbon nanotube film is about 0.05 $g/m^2$. Since the carbon nanotube film has a minimal thickness and the heat capacity of the carbon nanotube is itself small, the carbon nanotube film has small heat capacity per unit area. In one embodiment, the heat capacity per unit area of the carbon nanotube film is less than $2 \times 10^{-4}$ $J/cm^2 \cdot K$.

The carbon nanotube film structure 112 may include at least two stacked carbon nanotube films. In one embodiment, a number of layers of the stacked carbon nanotube film is 50 layers or less. In another embodiment, the number of layers of the stacked carbon nanotube film is 10 layers or less. Additionally, an angle can exist between the orientation of carbon nanotubes in adjacent carbon nanotube films. Adjacent carbon nanotube films can be combined by only Van der Waals attractive forces therebetween without the need of an adhesive.

Figure 5:
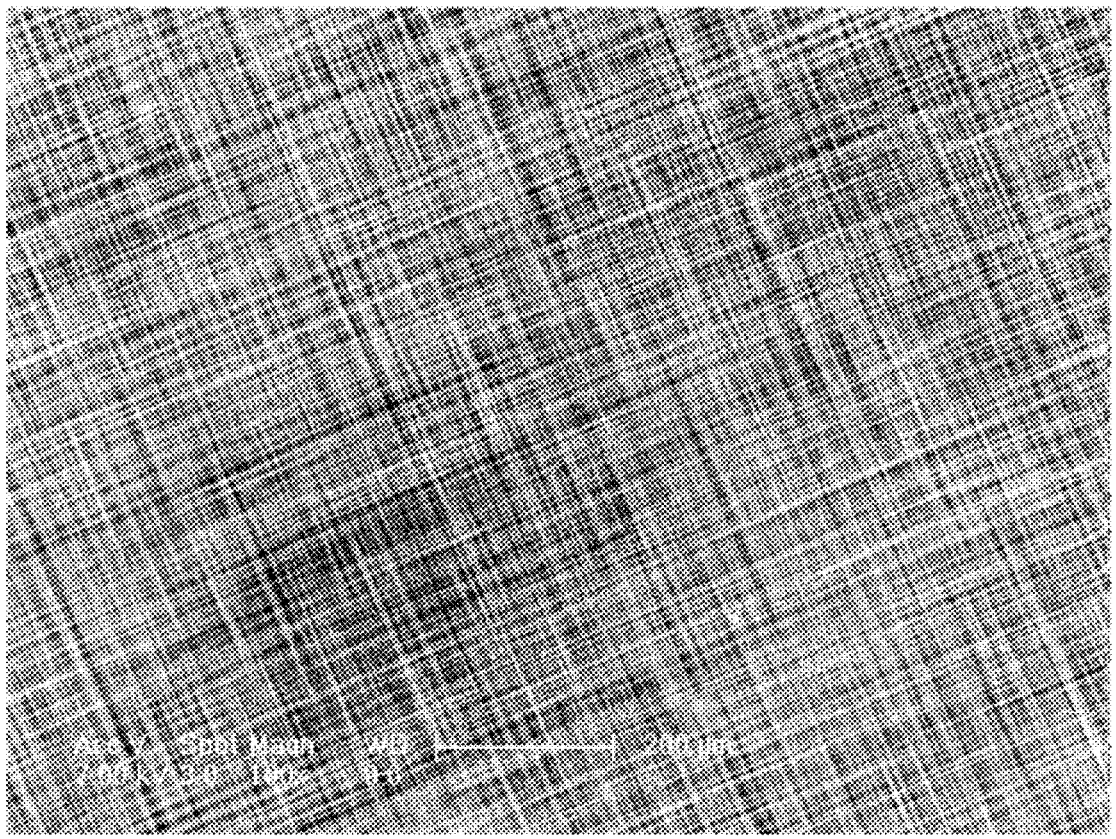
FIG. 5 is a SEM image of a carbon nanotube film structure.

An angle between the aligned directions of the carbon nanotubes in two adjacent carbon nanotube films can range from about 0 degrees to about 90 degrees. In one embodiment, referring to FIG. 5, the carbon nanotube film structure 112 includes at least two stacked carbon nanotube films, and the angle between the aligned directions of the carbon nanotubes in the two adjacent carbon nanotube films is 90 degrees.

In S2, the photoactive material 114 is located on the surface of the carbon nanotube film structure 112 by a plurality of methods, such as solution method, vapor deposition method, plating method or chemical plating method. The deposition method may be chemical vapor deposition (CVD) method or physical vapor deposition (PVD) method.

A solution method for depositing the photoactive material 114 on the surface of the carbon nanotube film structure 112 comprises the steps of: (21) dissolving or uniformly dispersing the photoactive material 114 in a solvent to form a mixture; (22) uniformly attaching the mixture to the carbon nanotube film structure 112 by spray coating method, spin coating method, or dip coating method; (23) evaporating and drying the solvent to make the photoactive material 114 uniformly attach on the surface of the carbon nanotube film structure 112. In the (S21), the mixture can be a solution or a dispersion.

When the photoactive material 114 includes a plurality of materials, the plurality of materials can be dissolved in a liquid phase solvent and mixed with a required ratio in advance, so that the plurality of materials can be disposed on different locations of the carbon nanotube film structure 112 by the required ratio.

Figure 6:
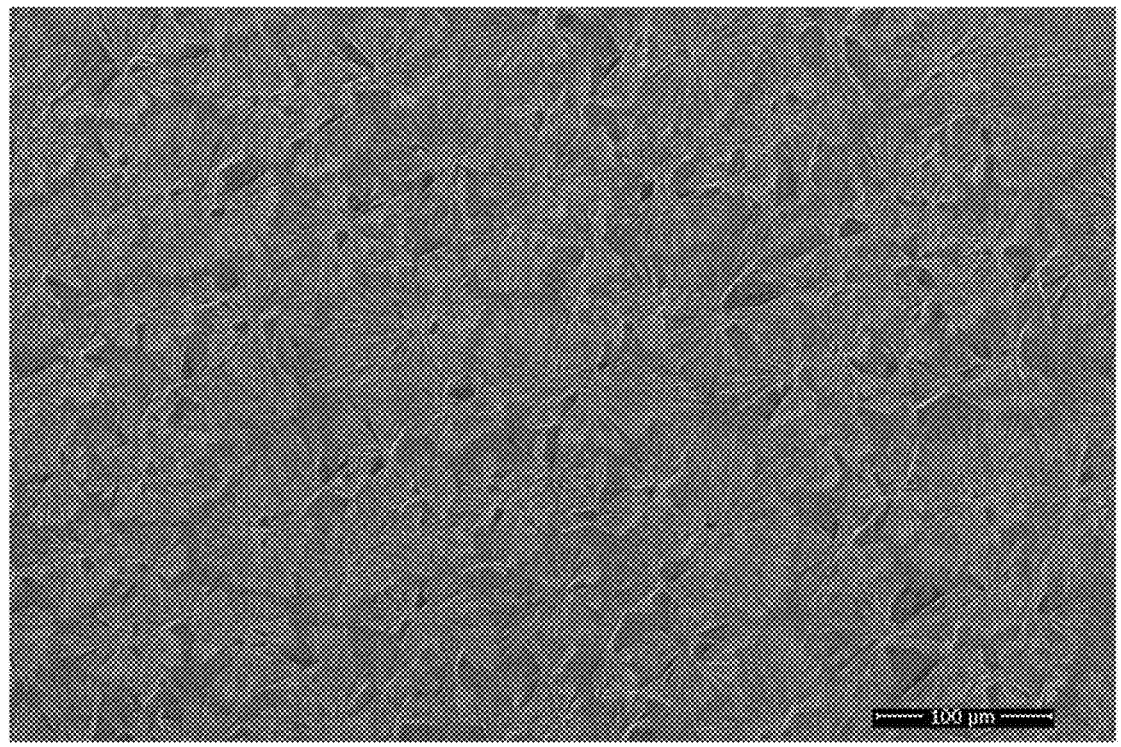
FIG. 6 and FIG. 7 are SEM images of one embodiment of the evaporating source under different resolutions.
Figure 7:
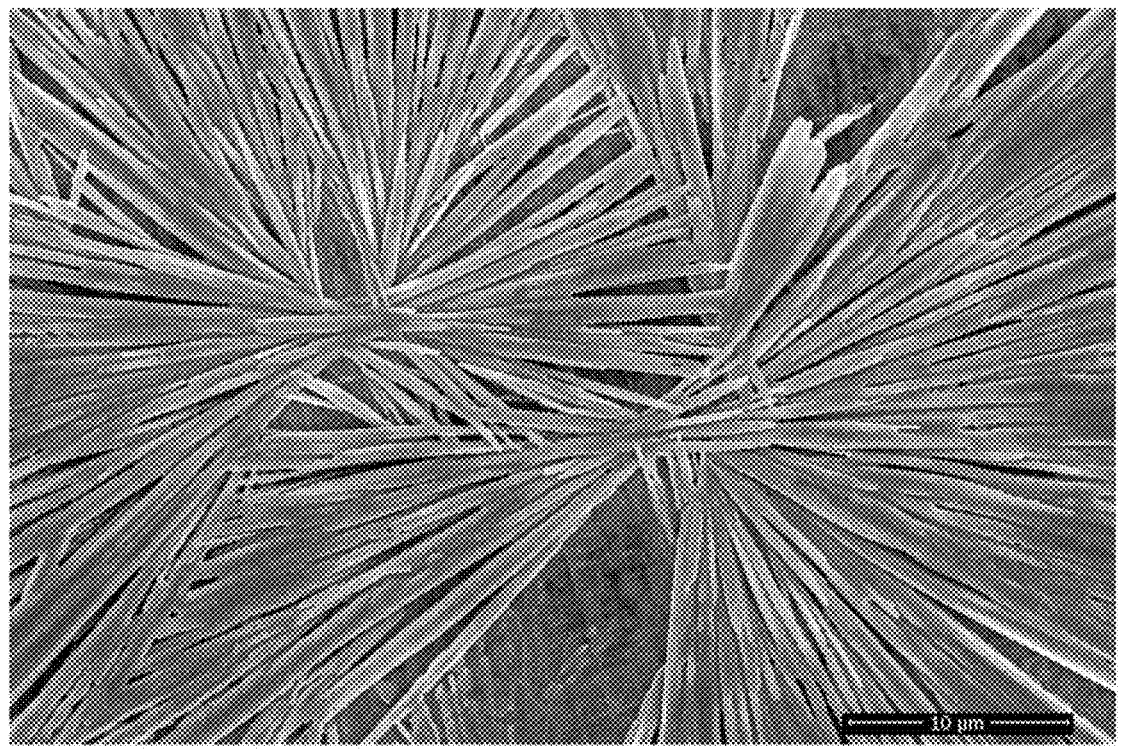

Referring FIG. 6 and FIG. 7, in one embodiment, a solution method for depositing the photoactive material 114 on the surface of the carbon nanotube film structure 112 comprises steps of: (a) dispersing methyl ammonium iodide and lead iodide uniformly in an organic solvent with a stoichiometric ratio to form a dispersion; (b) spraying the dispersion on the surface of the carbon nanotube film structure 112; (c) evaporating and drying the organic solvent on the surface of the carbon nanotube film structure 112. The step of spraying and drying can be repeated many times so that the photoactive material 114 on the surface of the carbon nanotube film structure 112 has a required amount.

The photoactive material 114 is adhered on and coats the surface of the carbon nanotube film structure 112. Macroscopically, the photoactive material 114 can be seen as a layer formed on at least one surface of the carbon nanotube film structure 112. In one embodiment, the photoactive material 114 is coated on two surfaces of the carbon nanotube film structure 112. The photoactive material 114 and the carbon nanotube film structure 112 form a composite membrane. In one embodiment, a thickness of the composite membrane is less 100 microns or less. In another embodiment, the thickness of the composite membrane is 5 microns or less. An amount of the photoactive material 114 carried per unit area of the carbon nanotube film structure 112 is small. Thus, in microscopic terms, a morphology of the photoactive material 114 may be nanoscale particles or layers with nanoscale thickness, being attached to a single carbon nanotube surface or the surfaces of a few carbon nanotubes. In one embodiment, the morphology of the photoactive material 114 is particles. A diameter of the particles is in a range from about 1 nanometer to 500 nanometers. In another embodiment, the morphology of the photoactive material 114 is a layer. A thickness of the photoactive material 114 is in a range from about 1 nanometer to 500 nanometers. The photoactive material 114 can completely cover and coat a single carbon nanotube for all or part of its length. The morphology of the photoactive material 114 coated on the surface of the carbon nanotube film structure 112 is associated with the amount of the photoactive material 114, species of the photoactive material 114, a wetting performance of the carbon nanotubes, and other properties. For example, the photoactive material 114 is more likely to be particle when the photoactive material 114 is not soaked in the surface of the carbon nanotube. The photoactive material 114 is more likely to uniformly coat a single carbon nanotube surface to form a continuous layer when the photoactive material 114 is soaked in the surface of carbon nanotubes. In addition, when the photoactive material 114 is an organic material having high viscosity, it may form a continuous film on the surface of the carbon nanotube film structure 112. No matter what the morphology of the photoactive material 114 may be, the amount of photoactive material 114 carried by per unit area of the carbon nanotube film structure 112 is small. Thus, the electromagnetic signal or the electrical signal can instantaneously and completely gasify the photoactive material 114. In one embodiment, the photoactive material 114 is completely gasified within 1 second. In another embodiment, the photoactive material 114 is completely gasified within 10 microseconds. The photoactive material 114 is uniformly disposed on the surface of the carbon nanotube film structure 112 so that different locations of the carbon nanotube film structure 112 carry substantially equal amounts of the photoactive material 114.

In the S3, the evaporating source 110 is spaced from the first electrode 220 and the substrate 210. The evaporating source 110 faces to the first electrode 220. A distance between the first electrode 220 and the carbon nanotube film structure 112 is substantially equal. The carbon nanotube film structure 112 is substantially parallel to a depositing surface. In one embodiment, the depositing surface is a surface of the first electrode 220. The carbon nanotube film structure 112 coated with the photoactive material 114 faces and is spaced from the depositing surface, and a distance between the carbon nanotube film structure 112 and the depositing surface is in a range from about 1 micrometer to about 10 millimeters. The area of the depositing surface is equal to or less than the macro area of the carbon nanotube film structure 112. Thus, a gaseous photoactive material 114 can reach the depositing surface substantially at the same time.

Figure 8:
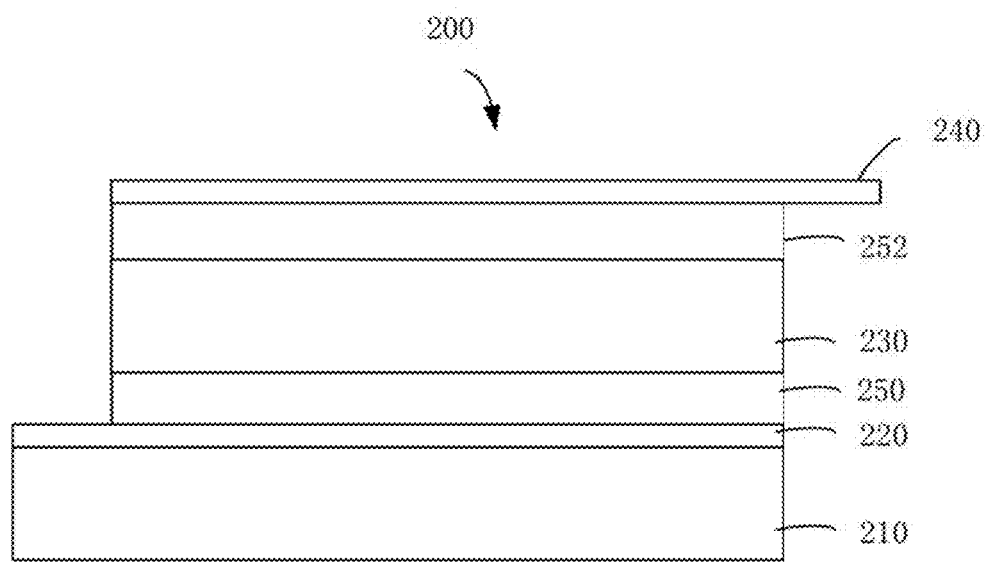
FIG. 8 is a side view of another embodiment of the organic thin film solar battery.

Referring FIG. 8, in one embodiment, the method for forming the organic thin film solar battery 200 can further comprises a step of forming a functional layer 250 on a surface of the first electrode 220. The functional layer 250 comprises a first surface and a second surface. The first surface and the second surface are opposite to each other. The first surface of the functional layer 250 is in contact with the first electrode 220. The second surface of the functional layer 250 can be the depositing surface to be coated with the photoactive material 114. The functional layer 250 can be selected according to species of the organic thin film solar battery 200 and the material of the photoactive layer 230. For example, the functional layer 250 can be an electron transferring layer or a hole transferring layer.

In one embodiment, the method for forming the organic thin film solar battery 200 can further comprises a step of forming the electron transferring layer on the surface of the first electrode 220 before step S3. The electron transferring layer can be a $TiO_2$ layer or an $Al_2O_3$ layer. A distance between the carbon nanotube film structure 112 coated by photoactive material 114 and the electron transferring layer is in a range from about 1 micrometer to about 10 millimeters.

The S3 can be carried out in atmosphere or in a vacuum. In one embodiment, the evaporating source 110 and the photoactive material 114 are located in a vacuum room 130. The electromagnetic signal or the electrical signal is inputted to the carbon nanotube film structure 112 to evaporate the photoactive material 114 and form the photoactive layer 230 on the first electrode 220.

When the electromagnetic signal or the electrical signal is inputted to heat the carbon nanotube film structure 112, the photoactive material 114 is rapidly heated to evaporation or sublimation temperature. Since per unit area of the carbon nanotube film structure 112 carries a small amount of the photoactive material 114, all the photoactive material 114 may instantly gasify. The carbon nanotube film structure 112 and the first electrode 220 are parallel to and spaced from each other. In one embodiment, the distance between the first electrode 220 and the carbon nanotube film structure 112 is in a range from about 1 micrometer to about 10 millimeters. Since the distance between the carbon nanotube film structure 112 and the first electrode 220 is small, a gaseous photoactive material 114 evaporated from the carbon nanotube film structure 112 is rapidly attached to the first electrode depositing surface to form the photoactive layer 230. The area of the first electrode depositing surface is equal or less than the macro area of the carbon nanotube film structure 112. The carbon nanotube film structure 112 can completely cover the depositing surface. Thus, the photoactive material 114 is evaporated to the depositing surface as a correspondence to the carbon nanotube film structure 112 to form the photoactive layer 230. Since the photoactive material 114 is uniformly carried by the carbon nanotube film structure 112, the photoactive layer 230 is also a uniform structure. When the photoactive material 114 comprises the plurality of materials, a proportion of the plurality of materials is same in different locations of the carbon nanotube film structure 112. Thus, the plurality of materials still has same proportion in the gaseous photoactive material 114, and a uniform photoactive layer 230 can be formed on the depositing surface.

The electromagnetic signal can be inputted to the carbon nanotube film structure 112 by an electromagnetic signal input device 140. The electromagnetic signal input device 140 may be located in the vacuum room 130 or outside the vacuum room 130 as long as an emitted electromagnetic signal can be transmitted to the carbon nanotube film structure 112. An average power density of the electromagnetic signal is in a range from about 100 mW/mm$^2$ to 20 W/mm$^2$. Since the structure of the carbon nanotube film structure 112 has the large specific surface area, the carbon nanotube film structure 112 can quickly exchange heat with surrounding medium, and heat signals generated by the carbon nanotube film structure 112 can quickly heat the photoactive material 114. Since the amount of the photoactive material 114 located on per unit macro area of the carbon nanotube film structure 112 is small, the photoactive material 114 can be completely gasified instantly by the heat signals.

Figure 9:
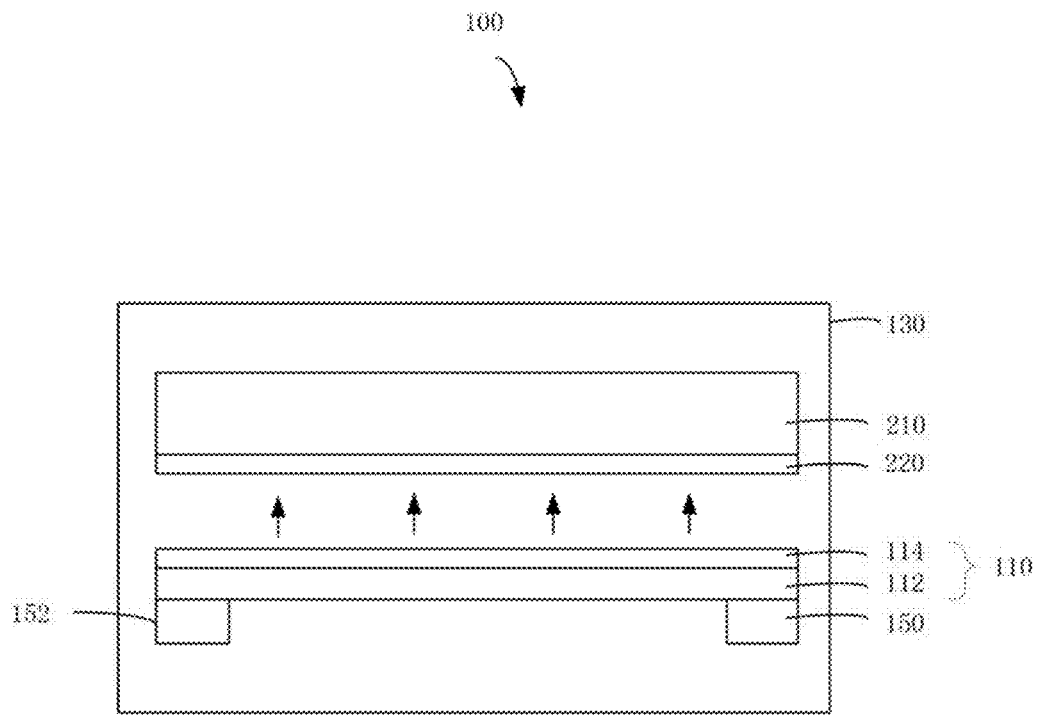
FIG. 9 is a side view of another embodiment of the apparatus for forming the organic thin film solar battery.

Referring FIG. 9, the electrical signal can be inputted to the carbon nanotube film structure 112 by a first electrical signal input electrode 150 and a second electrical signal input electrode 152. The first electrical signal input electrode 150 and the second electrical signal input electrode 152 are spaced from each other and electrically connected to the carbon nanotube film structure 112. In one embodiment, the carbon nanotube film structure 112 is suspended by the first electrical signal input electrode 150 and the second electrical signal input electrode 152. The carbon nanotube film structure 112 is a resistive element. The carbon nanotube film structure 112 has the small heat capacity per unit area and has the large specific surface area but the minimal thickness. In one embodiment, the heat capacity per unit area of the carbon nanotube film structure 112 is less than $2 \times 10^{-4}$ J/cm$^2$·K. In another embodiment, the heat capacity per unit area of the carbon nanotube film structure 112 is less than $1.7 \times 10^{-6}$ J/cm$^2$·K. The specific surface area of the carbon nanotube film structure 112 is larger than 200 m$^2$/g. The thickness of the carbon nanotube film structure 112 is less than 100 micrometers. The first electrical signal input electrode 150 and the second electrical signal input electrode 152 input the electrical signal to the carbon nanotube film structure 112. Since the carbon nanotube film structure 112 has the small heat capacity per unit area, the carbon nanotube film structure 112 can convert electrical energy to heat quickly, and a temperature of the carbon nanotube film structure 112 can rise rapidly. Since the carbon nanotube film structure 112 has the large specific surface area and is very thin, the carbon nanotube film structure 112 can rapidly transfer heat to the photoactive material 114. The photoactive material 114 is rapidly heated to the evaporation or sublimation temperature.

The first electrical signal input electrode 150 and the second electrical signal input electrode 152 are electrically connected to the carbon nanotube film structure 112. In one embodiment, the first electrical signal input electrode 150 and the second electrical signal input electrode 152 are directly located on the surface of the carbon nanotube film structure 112. The first electrical signal input electrode 150 and the second electrical signal input electrode 152 can input a current to the carbon nanotube film structure 112. The first electrical signal input electrode 150 and the second electrical signal input electrode 152 are spaced from each other and located at either end of the carbon nanotube film structure 112.

In one embodiment, the plurality of carbon nanotubes in the carbon nanotube film structure 112 extends from the first electrical signal input electrode 150 to the second electrical signal input electrode 152. When the carbon nanotube film structure 112 consists of one carbon nanotube film, or of at least two films stacked along a same direction (i.e., the carbon nanotubes in different carbon nanotube films being arranged in a same direction and parallel to each other), the plurality of carbon nanotubes of the carbon nanotube film structure 112 extend from the first electrical signal input electrode 150 to the second electrical signal input electrode 152. In one embodiment, the first electrical signal input electrode 150 and the second electrical signal input electrode 152 are linear structures and are perpendicular to extended directions of the carbon nanotubes of at least one carbon nanotube film in the carbon nanotube film structure 112. In one embodiment, the first electrical signal input electrode 150 and the second electrical signal input electrode 152 are same as a length of the carbon nanotube film structure 112, the first electrical signal input electrode 150 and the second electrical signal input electrode 152 thus extending from one end of the carbon nanotube film structure 112 to the other end. Thus, each of the first electrical signal input electrode 150 and the second electrical signal input electrode 152 is connected to two ends of the carbon nanotube film structure 112.

The carbon nanotube film structure 112 is the freestanding structure and can be suspended by the first electrical signal input electrode 150 and the second electrical signal input electrode 152. In one embodiment, the first electrical signal input electrode 150 and the second electrical signal input electrode 152 have sufficient strength to support the carbon nanotube film structure 112, and two supporters 120 may be omitted. The first electrical signal input electrode 150 and the second electrical signal input electrode 152 may be a conductive wire or conductive rod.

In the S3, the electrical signal is inputted to the carbon nanotube film structure 112 through the first electrical signal input electrode 150 and the second electrical signal input electrode 152. When the electric signal is a direct current signal, the first electrical signal input electrode 150 and the second electrical signal input electrode 152 are respectively electrically connected to a positive and a negative of a direct current source. The direct current power inputs the direct current signal to the carbon nanotube film structure 112 through the first electrical signal input electrode 150 and the second electrical signal input electrode 152. When the electrical signal is an alternating current signal, the first electrical signal input electrode 150 is electrically connected to an alternating current source, and the second electrical signal input electrode 152 is connected to earth. The temperature of the carbon nanotube film structure 112 can reach a gasification temperature of the photoactive material 114 by inputting an electrical signal power to the evaporating source 110. The electrical signal power can be calculated according to the formula $\sigma T^4 S$. Wherein $\sigma$ represents Stefan-Boltzmann constant; T represents the gasification temperature of the photoactive material 114; and S represents the macro area of the carbon nanotube film structure 112. The larger the macro area of the carbon nanotube film structure 112 and the higher the gasification temperature of the photoactive material 114, the greater the electrical signal power. Since the carbon nanotube film structure 112 has the small heat capacity per unit area, the carbon nanotube film structure 112 can quickly generate thermal response to raise the temperature. Since the carbon nanotube film structure 112 has the large specific surface area, the carbon nanotube film structure 112 can quickly exchange heat with surrounding medium, and heat signals generated by the carbon nanotube film structure 112 can quickly heat the photoactive material 114. Since the amount of the photoactive material 114 disposed on per unit macro area of the carbon nanotube film structure 112 is small, the photoactive material 114 can be completely gasified instantly by the heat signals.

Two or more different photoactive layers can be laminated on the first electrode 220 by changing the species of the photoactive material 114 and repeating the step S3 a plurality of times. For example, if the organic thin film solar battery 200 is a two-layer heterojunction type solar battery, an electron acceptor material layer and an electron donor material layer can be formed. The electron acceptor material layer and the electron donor material layer are formed on the surface of the first electrode 220 by two times of vapor deposition, thereby forming an interlayer heterojunction.

Figure 10:
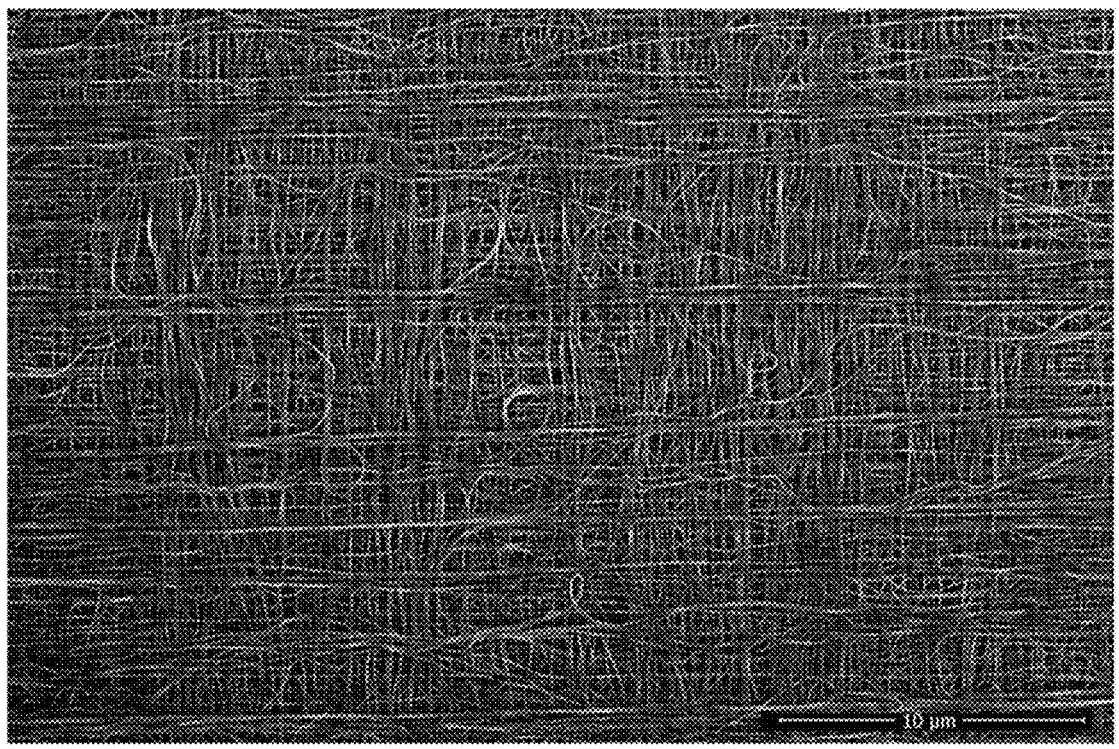
FIG. 10 is a SEM of one embodiment of the evaporating source after evaporation.
Figure 11:
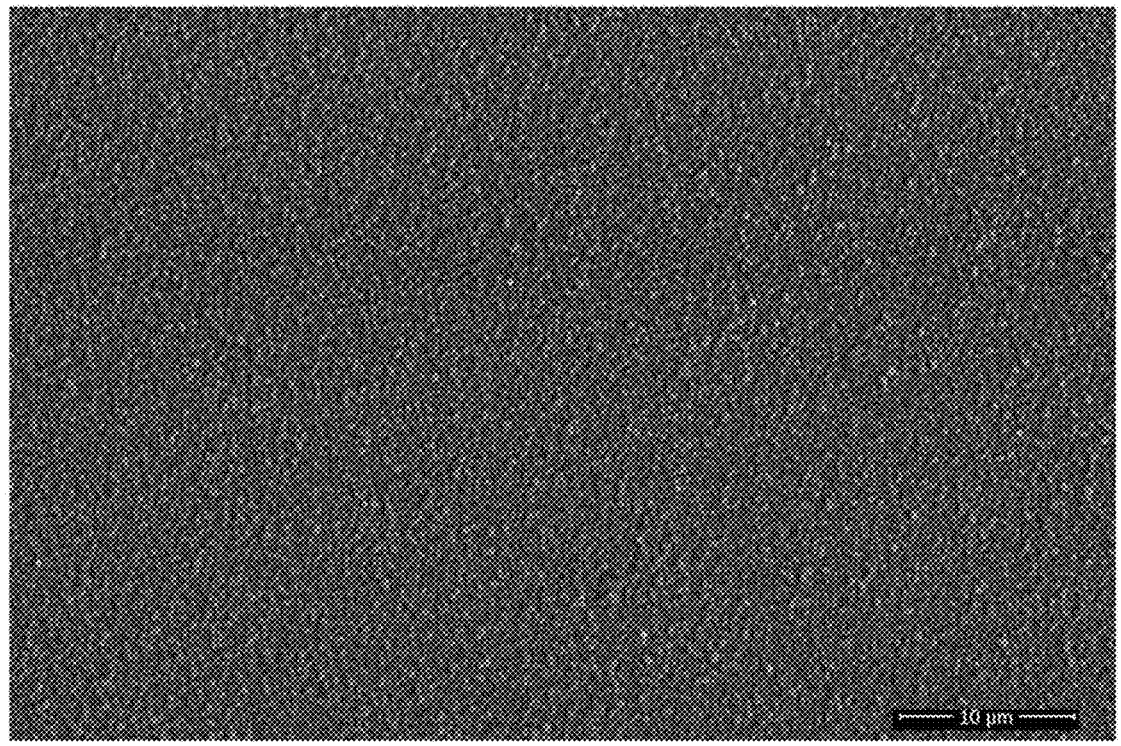
FIG. 11 is a SEM image of one embodiment of a photoactive layer.
Figure 12:
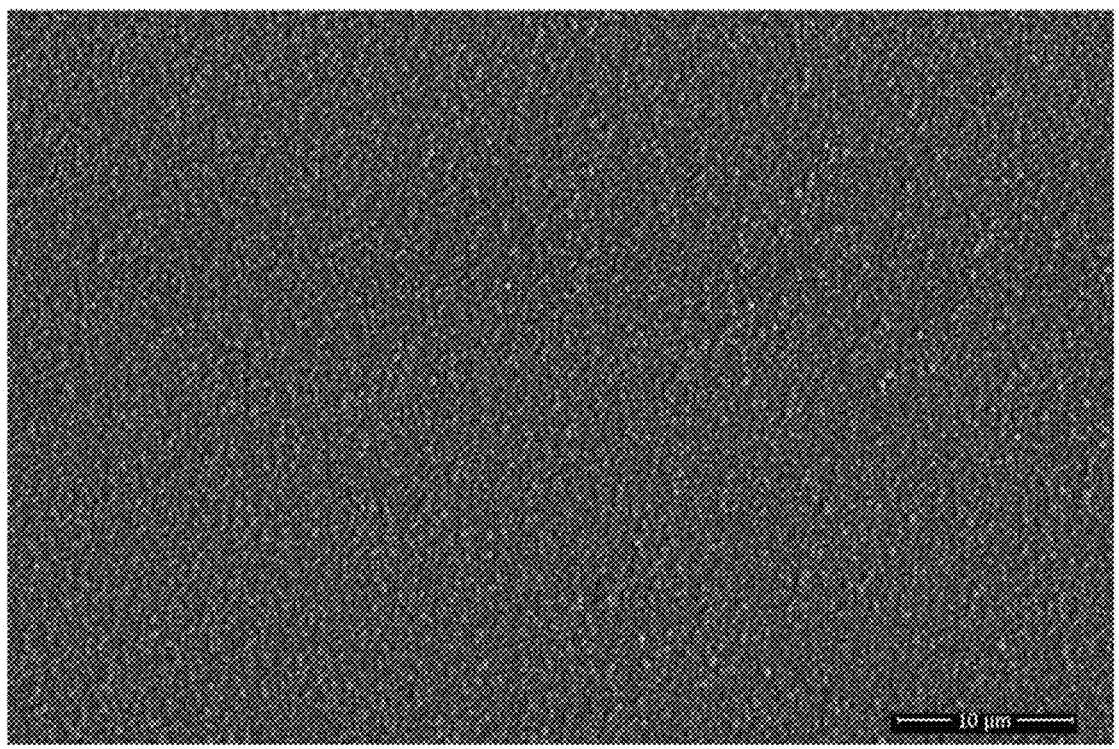
FIG. 12 is an X-ray diffraction (XRD) image of one embodiment of the photoactive layer.

Referring FIG. 9 and FIG. 10, in one embodiment, after inputting the electrical current to the carbon nanotube film structure 112, the temperature of the carbon nanotube film structure 112 rises quickly, the mixture of the methylammonium iodide and the lead iodide located on the surface of the carbon nanotube film structure 112 is instantly gasified, and a perovskite structure $CH_3NH_3PbI_3$ film is formed on the depositing surface. FIG. 10 shows a structure of the evaporating source 110 after vacuum evaporation. After evaporating the photoactive material 114 located on the surface structure of the carbon nanotube film structure 112, the carbon nanotube film structure 112 retains an original network structure, and the carbon nanotubes of the carbon nanotube film structure 112 are still joined end to end. FIG. 11 shows that the methylammonium iodide and the lead iodide continue a chemical reaction after gasification, and form a thin film having a uniform thickness on the depositing surface. Referring to FIG. 12, the thin film can be tested by XRD (X-ray diffraction). The XRD can determine and show as patterns that a material of the thin film is the perovskite structure $CH_3NH_3PbI_3$.

Figure 13:
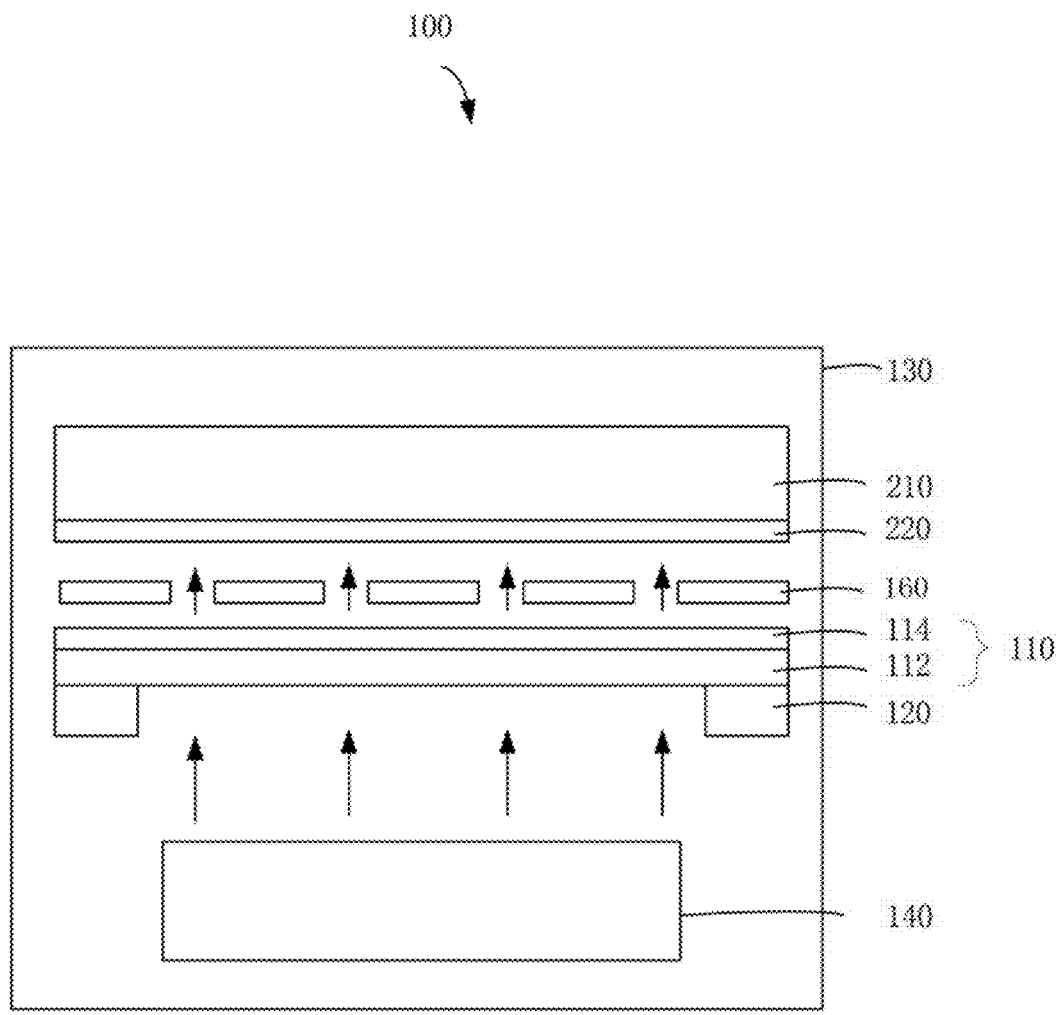
FIG. 13 is a side view of another embodiment of the apparatus for forming the organic thin film solar battery.

Referring FIG. 13, in one embodiment, the S3 further comprises a step of providing a patterned grid 160 and locating the patterned grid 160 between the evaporating source 110 and the surface of the first electrode 220 to form a patterned photoactive layer 230.

The patterned grid 160 comprises at least one through hole. The through hole can have a required shape and size. In one embodiment, the patterned grid 160 is respectively in direct contact with the depositing surface and the carbon nanotube film structure 112. In another embodiment, the patterned grid 160 is respectively spaced from the depositing surface and the carbon nanotube film structure 112. The patterned grid 160 is both parallel to the depositing surface and the carbon nanotube film structure 112. The gaseous photoactive material 114 is instantly adhered to the depositing surface to form the patterned photoactive layer 230 after passing through the through hole. A pattern of the patterned photoactive layer 230 is corresponding to the required shape and size of the through hole of the patterned grid 160.

The method for forming the organic thin film solar battery 200 can further comprises a step of forming a functional layer 252 on a surface of the photoactive layer 230 after the S3 and before S4. The functional layer 252 may be formed according to the species of the organic thin film solar battery 200 and a material of the photoactive layer 230. For example, the functional layer 252 can be the electron transferring layer or the hole transferring layer.

In one embodiment, the method for forming the organic thin film solar battery 200 can further comprises a step after the S3 and before S4: forming the hole transferring layer on the surface of the photoactive layer 230. The hole transferring layer can be a spiro-MeOTAD layer, a P₃HT layer, a CuI layer, a CuSCN layer or a PTAA layer.

One embodiment provides an apparatus 100 for forming the organic thin film solar battery 200. The apparatus 100 comprises an evaporating source 110 and a heating device. The evaporating source 110 comprises a carbon nanotube film structure 112 and a photoactive material 114. The carbon nanotube film structure 112 is a carrying structure for the photoactive material 114. The photoactive material 114 is located on a surface of the carbon nanotube film structure 112. The heating device is configured to input an electromagnetic signal or an electrical signal to the carbon nanotube film structure 112 to evaporate the photoactive material 114. In one embodiment, the heating device can input the electromagnetic signal to the carbon nanotube film structure 112 by an electromagnetic signal input device 140. In another embodiment, the heating device can input the electrical signal to the carbon nanotube film structure 112 by a first electrical signal input electrode 150 and a second electrical signal input electrode 152.

The apparatus 100 can further comprise a vacuum room 130. The evaporating source 110 and a substrate 210 are located in the vacuum room 130. The substrate 210 is spaced from the evaporating source 110.

The apparatus 100 can further comprise two supporters 120. The two supporters 120 are spaced from each other and located on two ends of the carbon nanotube film structure 112. The carbon nanotube film structure 112 is suspended by the two supporters 120.

The apparatus 100 can further comprise a patterned grid 160. The patterned grid 160 is located between the evaporating source 110 and a surface of a first electrode 220. The first electrode 220 is located on a surface of the substrate 210.

The carbon nanotube film is free-standing structure and used to carry a photoactive material. The carbon nanotube film has a large specific surface area and good uniformity so that the photoactive material carried by the carbon nanotube film can uniformly distribute on the carbon nanotube film before evaporation. The carbon nanotube film can be heated instantaneously. Thus the photoactive material can be completely gasified in a short time to form a uniform gaseous evaporating material, and the uniform gaseous evaporating material can be uniformly distributed in a large area. The distance between the depositing substrate and the carbon nanotube film is small. Thus the photoactive material carried on the carbon nanotube film can be substantially utilized to save the photoactive material and improve the deposition rate.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A method of forming an organic thin film solar battery comprising:
    S1: providing a substrate and an evaporating source, wherein the evaporating source comprises a carbon nanotube film structure and a photoactive material, the photoactive material is located on a surface of the carbon nanotube film structure, the carbon nanotube film structure comprises at least one carbon nanotube film, and the least one carbon nanotube film comprises a plurality of nanotubes joined end to end by Van der Waals attractive force;
    S2: forming a first electrode on a substrate surface;
    S3: spacing the evaporating source from the first electrode, and heating the carbon nanotube film structure to gasify the photoactive material and form a photoactive layer on a surface of the first electrode; and
    S4: forming a second electrode on a surface of the photoactive layer.

2. A method of forming an organic thin film solar battery comprising:
    S1: providing a substrate and an evaporating source, wherein the evaporating source comprises a carbon nanotube film structure and a photoactive material, the photoactive material is located on a surface of the carbon nanotube film structure, the photoactive material comprises a plurality of materials, and the plurality of materials are dissolved in a liquid phase solvent and mixed with each other;
    S2: forming a first electrode on a substrate surface;
    S3: spacing the evaporating source from the first electrode, and heating the carbon nanotube film structure to gasify the photoactive material and form a photoactive layer on a surface of the first electrode; and S4: forming a second electrode on a surface of the photoactive layer.

3. The method of claim 2, wherein the photoactive material is located on the surface of the carbon nanotube film structure by a solution method, a vapor deposition method, a plating method or a chemical plating method.

4. The method of claim 2, wherein a distance between the surface of the first electrode and the carbon nanotube film structure is in a range from about 1 micrometer to about 10 millimeters.

5. The method of claim 2, wherein the photoactive material is a mixture of methylammonium iodide and lead iodide.

6. A method of forming an organic thin film solar battery comprising:
S1: providing a substrate and an evaporating source, wherein the evaporating source comprises a carbon nanotube film structure and a photoactive material, the photoactive material is located on a surface of the carbon nanotube film structure, and the photoactive material is a mixture of methylammonium iodide and lead iodide;
S2: forming a first electrode on a substrate surface;
S3: spacing the evaporating source from the first electrode, and heating the carbon nanotube film structure to gasify the photoactive material and form a photoactive layer on a surface of the first electrode; and
S4: forming a second electrode on a surface of the photoactive layer.

7. The method of claim 6, wherein the photoactive material is located on the surface of the carbon nanotube film structure by a solution method, a vapor deposition method, a plating method or a chemical plating method.

8. The method of claim 6, wherein a distance between the surface of the first electrode and the carbon nanotube film structure is in a range from about 1 micrometer to about 10 millimeters.

9. The method of claim 3, wherein the solution method for depositing the photoactive material on the surface of the carbon nanotube film structure comprising:
S11, dispersing the photoactive material in a solvent to form a mixture;
S12, attaching the mixture to the carbon nanotube film structure;
S13, drying the solvent to make the photoactive material uniformly attach on the surface of the carbon nanotube film structure.

10. The method of claim 2, further comprising a step of forming an electron acceptor material layer and an electron donor material layer on the surface of the first electrode.

11. The method of claim 2, wherein in step S3, an electromagnetic signal is inputted to heat the carbon nanotube film structure by an electromagnetic signal input device.

12. The method of claim 2, wherein in step S3, an electrical signal is inputted to heat the carbon nanotube film structure by a first electrical signal input electrode and a second electrical signal input electrode.

13. The method of claim 2, further comprising a step of forming a functional layer on the surface of the photoactive layer after the S3 and before the S4, wherein the functional layer is an electron transferring layer or an hole transferring layer.

14. The method of claim 2, wherein the photoactive material is a mixture of methylammonium iodide and lead iodide.

15. The method of claim 2, wherein a heat capacity per unit area of the carbon nanotube film structure is less than $2\times10^{-4}$ J/$cm^2\cdot$ K, and a specific surface area of the carbon nanotube film structure is larger than 200 $m^2$/g.

16. The method of claim 6, further comprising a step of forming an electron acceptor material layer and an electron donor material layer on the surface of the first electrode.

17. The method of claim 6, wherein in step S3, an electromagnetic signal is inputted to heat the carbon nanotube film structure by an electromagnetic signal input device.

18. The method of claim 6, wherein in step S3, an electrical signal is inputted to heat the carbon nanotube film structure by a first electrical signal input electrode and a second electrical signal input electrode.

19. The method of claim 6, further comprising a step of forming a functional layer on the surface of the photoactive layer after the S3 and before the S4, wherein the functional layer is an electron transferring layer or an hole transferring layer.

* * * * *